United States Patent [19]

Arnal et al.

[11] Patent Number: 4,534,842

[45] Date of Patent: Aug. 13, 1985

[54] PROCESS AND DEVICE FOR PRODUCING A HOMOGENEOUS LARGE-VOLUME PLASMA OF HIGH DENSITY AND OF LOW ELECTRONIC TEMPERATURE

[75] Inventors: Yves Arnal, 44, Eybens; Jacques Pelletier, Saint Martin D'Heres; Claude Pomot, La Tronche, all of France

[73] Assignee: Centre National de la Recherche Scientifique (CNRS), Paris, France

[21] Appl. No.: 620,136

[22] Filed: Jun. 13, 1984

[30] Foreign Application Priority Data

Jun. 15, 1983 [FR] France ................. 83 10116
Jun. 15, 1983 [FR] France ................. 83 10117

[51] Int. Cl.³ .................... C25B 11/04; C23C 15/00
[52] U.S. Cl. .................... 204/192 E; 204/298; 422/186.03; 422/186.21; 422/186.25; 422/186.29
[58] Field of Search ............ 204/164, 192 E, 298; 422/186.03, 186.21, 186.25, 186.29

[56] References Cited

U.S. PATENT DOCUMENTS 4,158,589 6/1979 Keller ................. 204/192 E
4,316,791 2/1982 Taillet ................. 204/192 F
4,401,054 8/1983 Matsuo ................. 422/186.29

OTHER PUBLICATIONS

Schumacher et al., Journal of Applied Physics, vol. 47, No. 3, Mar. 1976, pp. 886–893.

*Primary Examiner*—John F. Niebling
*Attorney, Agent, or Firm*—Weingarten, Schurgin, Gagnebin & Hayes

[57] ABSTRACT

The invention relates to the production of plasma. The process according to the invention comprises the steps of: maintaining a gaseous medium in an enclosure at a pressure in the range of $10^{-5}$ to $10^{-1}$ Torr; exciting this gaseous medium in the enclosure by means of UHF waves in the range of one to ten gigahertz, producing a plasma; and maintaining this plasma in the enclosure by means of a magnetic confinement shell comprising many elongated magnetic elements arranged parallel to each other inside the enclosure near the respective interior surfaces, the faces of the magnetic elements which face the interior of the enclosure having alternating polarities. It is more particularly applicable to the microelectronics industry.

13 Claims, 4 Drawing Figures

PROCESS AND DEVICE FOR PRODUCING A HOMOGENEOUS LARGE-VOLUME PLASMA OF HIGH DENSITY AND OF LOW ELECTRONIC TEMPERATURE

The present invention relates to the production of plasma from gaseous media of any nature, used for various purposes.

A certain number of means for producing plasmas from any gaseous media are already known.

A process which employs a continuous discharge or a thermoemissive filament is for example known. These means do not enable a dense, homogeneous large-volume plasma to be obtained. In addition, when a thermoemissive filament is employed, such means can generally not be used with a gaseous medium which is reactive with respect to such a filament.

The production of plasma by a radiofrequency discharge is also known. The same drawbacks as those mentioned above must be attributed to such technical means, except the use of a corrosive gaseous medium which may be envisaged in that case. In addition, this method presents the drawback of producing a plasma of high electronic temperature. Furthermore, this method does not allow independent parameters for the generation of the plasma and for its use.

The production of plasma by means of UHF waves is also known. The plasmas obtained have an electronic temperature lower than that of the plasmas obtained by radiofrequency excitation, but are not always homogeneous and of large-volume. However, this method presents the advantage of rendering independent the parameters of plasma generation and those of its use.

The production of plasma excited by a thermoemissive filament and maintained spatially by magnetic confinement is also known. Such a method makes it possible to obtain a plasma of homogeneous large volume, of high density, of low electronic temperature, with independence of the parameters of plasma generation from those of its use.

However, such a method presents considerable drawbacks, particularly as far as the reliability in time of the emissive filament and the pollution of the ambient medium for which it is responsible, are concerned.

Furthermore, the heat radiation of the filament is detrimental to the stable development of the process of formation of the plasma and involves a temperature rise time for each phase of generation.

In addition, taking into account the presence of the thermoemissive filament, such a method cannot be used in the case of ionization of a gaseous medium of nature which is reactive with respect to the matter constituting the filament.

It has also been proposed to produce a plasma excited by a thermoemissive filament maintained by electrostatic confinement. In addition to the above drawbacks, it should be noted that such a method does not enable a plasma of homogeneous large volume to be obtained.

The heretofore known means are therefore unsatisfactory as it is more and more necessary for modern techniques to have available, in very diverse domains of application, dense, homogeneous large-volume plasmas of low electronic temperature, produced from a gaseous medium, reactive or not, and of which the parameters of generation are independent of those of its use.

This is the case in particular in the domains where it is necessary to produce positive or negative ions at a relatively low cost or when an engraving, deposit or oxidation is to be effected.

In particular, this is the case in a preferred application of the present invention, consisting in the surface treatment of the diverse substrates in the microelectronics industry. In such a domain, it is in fact necessary to be able to act with precision, whilst employing the lowest possible energies, on layers of small thickness in which, for example, an anisotropic engraving it to be carried out with precision.

It is an object of the invention to overcome the shortcomings of the prior art technique by proposing a novel process and a novel device for producing a continuous, homogeneous large-volume plasma of high density and low electronic temperature, from a gaseous medium, reactive or not.

It is another object of the invention to propose a novel process and a novel device for obtaining a plasma of which the parameters governing its creation or generation are totally independent of those concerning the interaction between this plasma and the application made thereof.

To attain the above objects, the invention is characterized in that it comprises the steps of:

proceeding by UHF waves with the excitation of a gaseous medium in an enclosure, maintaining this plasma in the enclosure at least by multipolar magnetic confinement, employing means adapted to maintain in the enclosure an absolute pressure of between $10^{-5}$ and $10^{-1}$ Torrs.

The invention also relates to a device, characterized in that it comprises:

a tight enclosure connected to a pumping circuit and to a circuit for supplying a gaseous medium, these circuits being adapted to maintain a determined pressure in the enclosure, a shell for at least multipolar magnetic confinement, a UHF wave generator terminating in a device for excitation of the gaseous medium, this device being placed opposite a window in the shell, and means for analyzing the plasma within the confinement shell.

The invention will be more readily understood on reading the following description with reference to the accompanying drawings, in which.

Figure 1:
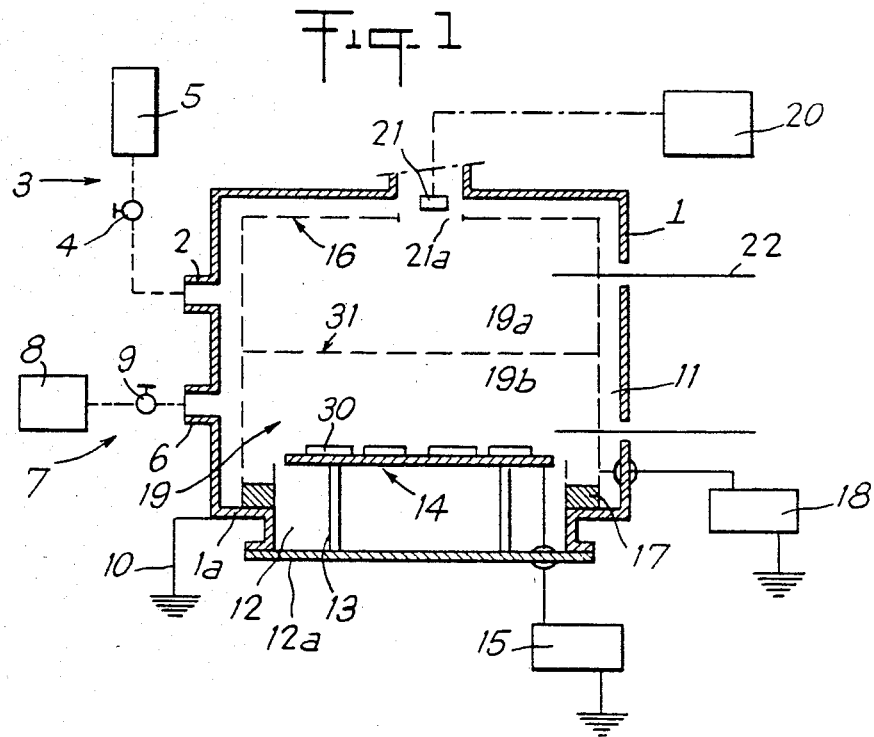
FIG. 1 is a schematic view of a device according to the invention for producing a homogeneous large-volume plasma.

According to the process of the invention, the production of a homogeneous large-volume plasma of high density and of low electronic temperature and of which the parameters governing its creation or generation are independent of those governing its subsequent use, consists in introducing into a tight enclosure a gaseous medium of any nature selected as a function of the subsequent application defined. This gaseous medium is maintained in the enclosure under an absolute pressure, for example of between some $10^{-5}$ and some $10^{-1}$ Torrs (one Torr=133 Pascals).

The gaseous medium used is continuously introduced into the enclosure so as to fill the latter, from which it may be extracted by appropriate pumping means.

Inside the enclosure, the gaseous medium is ionized via UHF waves delivered by an appropriate generator. The UHF waves used are in the 1 to 10 gigahertz range and are preferably close to 2.5 gigahertz.

The plasma produced in the enclosure by UHF waves is confined at least magnetically, in passive manner, by a multipolar shell, preferably formed inside the enclosure and allowing communication with the means for conducting and pumping the gaseous fluid.

In this way, it becomes possible to produce with excellent reliability a dense plasma of about $10^{11}$ cm$^{-3}$, of electronic temperature only slightly different from 1 electron volt, which is perfectly homogeneous, bereft of internal field and capable of occupying a large volume, for example of several hundreds of liters, defined by the multipolar magnetic confinement shell.

By reason of the absence of thermoemissive filament, this process further makes it possible to ionize a reactive gaseous medium, reactive in the general sense of the term, i.e. presenting a character of reaction with respect to any matter subjected to the action of this plasma.

It thus becomes possible to use such plasmas to act on the surface of diverse substrates, which may be exposed over a small or large surface within the confinement shell defined inside the enclosure.

This advantage is particularly appreciated in the case of application in microelectronics, as the high density, the considerable volume, the homogeneity or isotropy of the plasma and the independence of the parameters of creation of the plasma enable deposits, oxidations or engravings to be effected with precision. These treatments may be carried out over large surfaces whilst employing only a low level of energy, and making it possible to obtain, in the case of engraving, an anisotropic action in the direction of a field of displacement imparted by the application of an appropriate potential to the substrates.

In another domain of application, it may be provided to close the confinement shell over at least a part of its periphery by an extraction grid enabling large quantities of positive or negative ions to be produced from the plasma created, which ions may then be concentrated and accelerated as a function of the application envisaged.

According to the process of the invention, it may be provided to divide the confinement shell by a magnetic filter so as to lead to one part for creation of the plasma and one part for use in which said plasma presents an even lower electronic temperature.

In certain cases, the process may also consist in placing the multipolar magnetic confinement shell outside the enclosure.

In the case of a confinement shell inside the enclosure, it may be provided to add thereto electrostatic confinement means making it possible to reduce the electronic temperature by a factor of the order of 2 or, at high pressures, to increase the density of the plasma by a factor of the order of 5.

Referring now to the drawings, FIG. 1 schematically shows an installation or a device for producing a homogeneous large-volume plasma of high density and low electronic temperature.

This installation comprises an enclosure 1, preferably made of an amagnetic material, connected by a pipe 2 to means 3 for distributing an appropriate gaseous fluid delivered by a valve 4 from a storage tank 5. The enclosure 1 is also connected by a pipe 6 to pumping means 7 comprising a pump 8 and a flow adjusting valve 9.

To create a plasma inside the enclosure 1, the gaseous fluid is maintained at an absolute pressure of the order of $10^{-5}$ to $10^{-1}$ Torrs. To this end, for example, the pumping means are employed to create a relative vacuum then the means 3 are regulated so that the desired absolute pressure prevails.

The enclosure 1 is connected to earth 10 by any appropriate means.

The inner volume 11, defined by the enclosure 1, is accessible via an opening 12, for example made in the bottom wall 1a. The opening 12 is, in the present case, closed by a removable panel 12a supporting, by insulating feet 13, a substrate-carrier 14 which may be polarized in direct or alternating manner by a source of voltage 15 as well as thermostatted.

The inner volume 11 of the enclosure 1 contains a magnetic confinement shell 16 constituted by a multipolar cage which is maintained by insulating supports 17. This multipolar cage may be connected to earth or polarized via a source of voltage 18. The substrate carrier 14 is mounted so as to be disposed in the inner volume 19 of the magnetic confinement shell.

The enclosure 1 is associated with a generator 20 of UHF waves which excite the gaseous medium, by any appropriate means 21, to produce the plasma which diffuses inside the shell 16. The means 21 is to this end placed opposite a window 21a made in the shell 16. Means 22 for analyzing the plasma created are adapted on the closure 1 that they pass through, in the same way as the shell 16. These means 22 are for example constituted by LANGMUIR probes.

Figure 2:
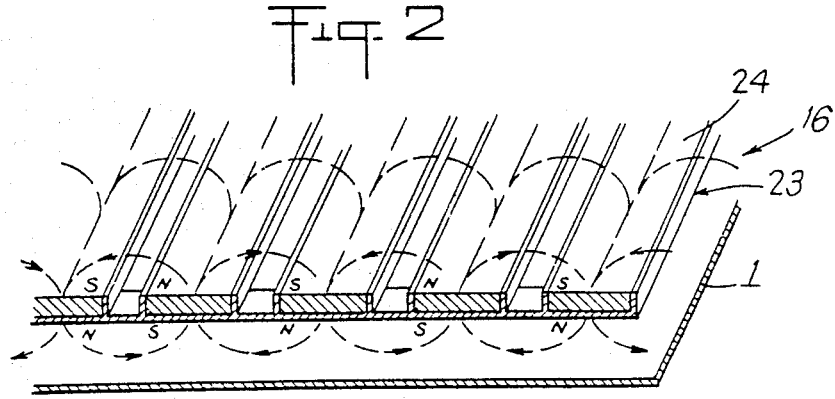
FIG. 2 is a partial perspective view illustrating the construction of one of the elements constituting the device.

In the example illustrated, the multipolar cage is constituted as illustrated in FIG. 2. This cage comprises an armature 23 supporting bars 24 of permanent magnetic character. The armature 23 is shaped so as to maintain the bars 24 parallel to one another, with a small relative spacing, so that, in addition, they each present, in the direction of the inner volume defined by the multipolar cage, a face of successively different polarity. The magnetic field thus created between the bars 24 and shown schematically by the arrows and references N and S in FIG. 2, has a reflector effect for the electrons of the plasma which is thus confined within volume 19. The armature 23 may be made of any amagnetic matter, for example stainless steel.

Figure 3:
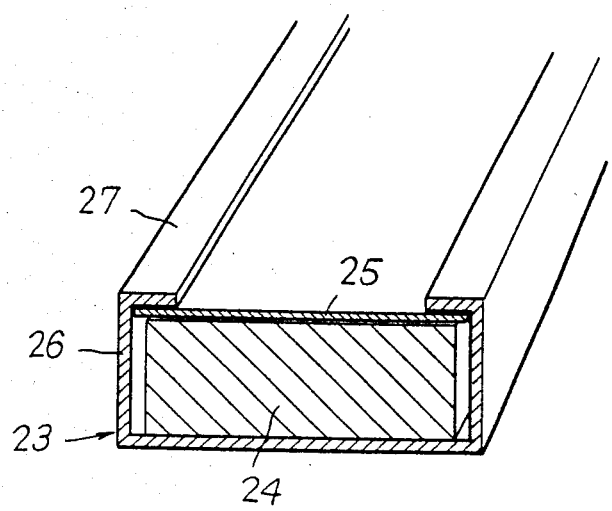
FIG. 3 is a partial perspective view, on a larger scale, of an element constituting the object of the invention.

So as to limit the loss of electrons in that part of the loss cones corresponding to the intersections of the lines of force of the field at right angles to each bar 24, it is advantageously provided to complete the magnetic confinement shell by passive electrostatic confinement means. These means comprise, for example, as illustrated in FIG. 3, a layer 25 of insulating material covering the face of each bar directed towards the inner volume defined by the cage 16. The layer 25 may be constituted by a sheet or film of insulating matter such as mica, kapton, etc . . . or may be formed by the deposit of a layer of insulating material made of $Al_2O_3$, $TiO_2$, etc . . . .

To this end, the armature 23 defines sectioned supports 26 with open cross-section, comprising, in the plane of the latter, raised edges 27 for maintaining the insulating sheet or layer 25.

Figure 4:
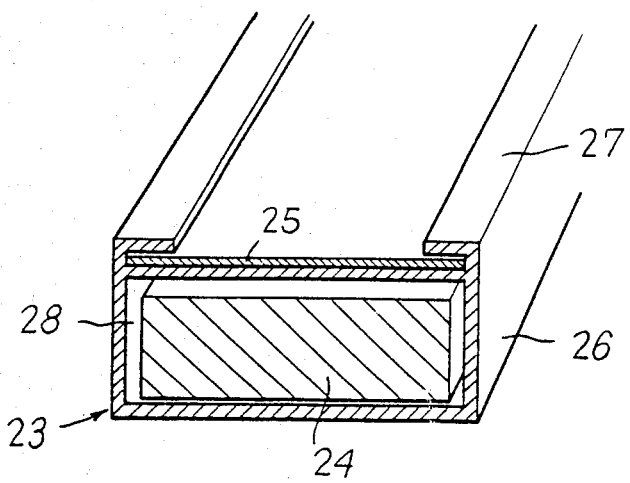
FIG. 4 is a perspective view similar to FIG. 3, but showing a variant embodiment.

In the cage of using reactive gaseous fluid, the armature 23 may be constituted, as illustrated by FIG. 4, so as to comprise, in place of supports 26, chords defining tight housing 28 in which the bars 24 are maintained and insulated.

In such a case, the electrostatic confinement means may be added to the face of each chord oriented towards the inner volume defined by the structure 16. These means may, as before, be a layer of insulating material or a plate, sheet or film of insulating material.

The association of a multipolar magnetic confinement and of a passive electrostatic confinement makes it possible, all else remaining equal, significantly to increase the density of a plasma, and more particularly towards high pressures. Such an increase may be by a factor of the order of 2 to 10.

The association also enables the electronic temperature of a plasma to be reduced by a factor of the order of 2.

The association also makes it possible, with a suitable gaseous medium, to increase the rate of production of negative ions.

Within the scope of application in the field of microelectronics, with a view for example to producing an engraving, an oxidation or a deposit on substrates such as 30, these latter are mounted fixed, immobilized in any appropriate manner on the substrate-carrier 14, so that the face to be treated is exposed to the plasma created within the volume 19.

In the case of application to the production of positive or negative ions, the opening 12 is fitted with a grid suitably polarized by the source 15 to produce extraction then possible acceleration of the ions produced.

FIG. 1 shows that it is possible also to improve the characteristics of the plasma produced, particularly by lowering its temperature by means of a magnetic filter 31 associated with the shell 16 so as to divide the volume 19 into a part 19a for production of the plasma and a part 19b for use thereof for exposure for example of the substrates 30. The magnetic filter 31 is made in a manner similar to what has been described hereinbefore concerning the magnetic confinement shell, except that the spacing between the bars 24 is larger, so as to offer an increased possibility of transmission of the plasma. The magnetic filter may also comprise electrostatic confinement means of the type of FIG. 3 or FIG. 4. In any case, the magnetic filter presents such a structure that the polarized faces of the bars 24 are parallel to the plane containing the filter and oriented towards the two parts of the volume.

The invention is not limited to the examples which have been described and shown, as various modifications may be made thereto without departing from its scope.

What is claimed is:

1. A process for producing a plasma of homogeneous large volume, of high density and of low electronic temperature, comprising the steps of:
    maintaining a gaseous medium in an enclosure at a pressure in the range of $10^{-5}$ to $10^{-1}$ Torr;
    exciting said gaseous medium in the enclosure by means of UHF waves in the range of one to ten gigahertz, producing a plasma; and
    maintaining this plasma in the enclosure by means of a magnetic confinement shell comprising a plurality of elongated magnetic elements arranged parallel to each other inside the enclosure near the respective interior surfaces, the faces of alternate said magnetic elements which face the interior of the enclosure being of opposite polarity.

2. The process of claim 1, wherein the magnetic elements are supported by armatures which cover their sides and the faces which face outwardly from the enclosure, and the faces of said magnetic elements which face the interior of the enclosure are covered by a layer of insulating material.

3. The process of claim 1, wherein a magnetic filter is employed to separate the volume occupied by the plasma into a part for creating said plasma and a part for use of said plasma.

4. The process of claim 1, 2 or 3, wherein ions are extracted from the plasma produced in the enclosure by means of a suitably polarized grid.

5. The process of one of claims 1, 2 or 3, wherein a reactive gaseous medium is excited.

6. The process of claim 1, wherein the gaseous medium is excited by means of UHF waves close to 2.45 gigahertz.

7. A device for producing a plasma of homogeneous large volume, of high density and of low electronic temperature, comprising:
    a tight enclosure connected to a pumping circuit and to a circuit for supplying a gaseous medium, these circuits being adapted to maintain a predetermined pressure in the ranges of $10^{-5}$ to $10^{-1}$ Torr in the enclosure;
    a magnetic confinement shell comprising a plurality of elongated magnetic elements arranged parallel to each other inside the enclosure near the respective interior surfaces, the faces of alternate said magnetic elements which face the interior of the enclosure being of opposite polarity;
    a UHF wave generator terminating in a device for excitation of the gaseous medium, this device being placed opposite a window in the shell;
    and means for analyzing the plasma within the confinement shell.

8. The device of claim 7, wherein the enclosure further comprises an opening closed by a removable panel supporting a substrate carrier extending into the magnetic confinement shell and connected to a source of polarization.

9. The device of claim 7, wherein the enclosure further comprises an opening occupied by an ion extraction grid connected to a source of polarization.

10. The device of claim 7, wherein the magnetic confinement shell is associated with a magnetic filter dividing the shell into two parts.

11. The device of claim 6, wehrein the magnetic elements are supported by armatures which cover their sides and the faces which face outwardly from the enclosure, and the faces of said magnetic elements which face the interior of the enclosure are covered by a layer of insulating material.

12. The device of claim 11, wherein the magnetic elements are covered on the faces which face the interior of the enclosure by a sheet of insulating material maintained in front of each magnetic element by raised edges formed by an open section forming part of the supporting armature and adapted to maintain a bar.

13. The device of claim 11, wherein each magnetic element is covered by a sheet of insulating material maintained by two raised edges of a section defining a tight housing adapted to contain a bar.

* * * * *

UNITED STATES PATENT AND TRADEMARK OFFICE
CERTIFICATE OF CORRECTION

PATENT NO. : 4,534,842
DATED : August 13, 1985
INVENTOR(S) : Yves Arnal; Jacques Pelletier; Claude Pomot It is certified that error appears in the above-identified patent and that said Letters Patent is hereby corrected as shown below:

Column 2, line 9, "it to be" should read --is to be--

Column 4, line 66, "cage" should read --case--

Column 6, line 51, "claim 6, wehrein" should read --claim 10, wherein--

Signed and Sealed this

Sixteenth Day of December, 1986

Attest:

DONALD J. QUIGG

Attesting Officer   Commissioner of Patents and Trademarks